US012439682B2

(12) United States Patent
Giandalia et al.

(10) Patent No.: US 12,439,682 B2
(45) Date of Patent: Oct. 7, 2025

(54) MONOLITHIC HIGH SIDE GALLIUM NITRIDE DEVICE WITH INTEGRATED CAPACITIVE LEVEL SHIFTER CIRCUITS

(71) Applicant: Navitas Semiconductor Limited, Dublin (IE)

(72) Inventors: Marco Giandalia, Marina Del Rey, CA (US); Santosh Sharma, Austin, TX (US); Jung Hee Lee, Rolling Hills Estates, CA (US); Daniel M. Kinzer, El Segundo, CA (US)

(73) Assignee: Navitas Semiconductor Limited, Dublin (IE)

( * ) Notice: Subject to any disclaimer, the term of this patent is extended or adjusted under 35 U.S.C. 154(b) by 533 days.

(21) Appl. No.: 18/051,799

(22) Filed: Nov. 1, 2022

(65) Prior Publication Data
US 2023/0139736 A1    May 4, 2023

Related U.S. Application Data

(60) Provisional application No. 63/263,439, filed on Nov. 2, 2021.

(51) Int. Cl.
*H02M 1/08*    (2006.01)
*H02M 3/00*    (2006.01)
(Continued)

(52) U.S. Cl.
CPC ............ *H10D 84/811* (2025.01); *H02M 1/08* (2013.01); *H02M 3/003* (2021.05); *H10D 84/01* (2025.01)

(58) Field of Classification Search
CPC ...... H10D 84/811; H10D 84/01; H10D 84/05; H02M 1/08; H02M 1/0006; H02M 3/158
See application file for complete search history.

(56) References Cited

U.S. PATENT DOCUMENTS 9,570,927 B2 *  2/2017  Kinzer .................... H02J 7/00
10,193,554 B1   1/2019  Sharma et al.
(Continued)

FOREIGN PATENT DOCUMENTS

CN    107005163 A    8/2017
CN    109951178 A    6/2019
(Continued)

OTHER PUBLICATIONS

U.S. Appl. No. 15/814,317, "First Action Interview Office Action Summary", May 22, 2018, 6 pages.
(Continued)

*Primary Examiner* — Kyle J Moody
(74) *Attorney, Agent, or Firm* — FisherBroyles, LLP (57) ABSTRACT

Monolithic high side GaN-based circuits using capacitors for level shifting. In one aspect, a power converter includes a GaN-based die, a switch formed on the GaN-based die and having a gate terminal, where the switch is arranged to be selectively conductive according to a driver signal applied to the gate terminal, a buffer circuit formed on the GaN-based die and arranged to receive an input signal and generate a corresponding differential output signal at a first output terminal and at a second output terminal, and a voltage level converter formed on the GaN-based die and having a first input terminal coupled to the first output terminal via a first capacitor and having a second input terminal coupled to the second output terminal via a second capacitor, where the first and second capacitors are formed on the GaN-based die, and the voltage level converter is arranged to generate the driver signal.

20 Claims, 7 Drawing Sheets

(51) Int. Cl.
    *H10D 84/01*     (2025.01)
    *H10D 84/80*     (2025.01)

(56) References Cited

U.S. PATENT DOCUMENTS

2016/0079975 A1    3/2016    Kinzer et al.
2017/0279287 A1    9/2017    Solodovnik et al.

FOREIGN PATENT DOCUMENTS

| | | |
|---|---|---|
| CN | 110176858 A | 8/2019 |
| CN | 110401365 A | 11/2019 |
| CN | 110401369 A | 11/2019 |
| CN | 110445373 A | 11/2019 |
| JP | 6535539 B2 | 6/2019 |
| TW | 200633357 A | 9/2006 |

OTHER PUBLICATIONS

U.S. Appl. No. 15/814,317, "First Action Interview Pilot Program Pre-Interview Communication", Feb. 14, 2018, 4 pages.
U.S. Appl. No. 15/814,317, "Notice of Allowance", Sep. 26, 2018, 9 pages.
TW111141541, "Office Action", Jul. 6, 2023, 6 pages.

\* cited by examiner

MONOLITHIC HIGH SIDE GALLIUM NITRIDE DEVICE WITH INTEGRATED CAPACITIVE LEVEL SHIFTER CIRCUITS

CROSS-REFERENCE TO RELATED APPLICATIONS

This application claims priority to U.S. provisional patent application Ser. No. 63/263,439, for "MONOLITHIC HIGH SIDE GALLIUM NITRIDE DEVICE WITH INTEGRATED CAPACITIVE LEVEL SHIFTER CIRCUITS" filed on Nov. 2, 2021, the contents of which are incorporated herein by reference in their entirety for all purposes.

FIELD

The described embodiments relate generally to power conversion circuits using gallium nitride devices, and more particularly, the present embodiments relate to monolithic high side gallium nitride devices with integrated capacitive level shifter circuits.

BACKGROUND

Electronic devices such as computers, servers and televisions, among others, employ one or more electrical power conversion circuits to convert one form of electrical energy to another. Some electrical power conversion circuits convert a high DC voltage to a lower DC voltage using a circuit topology called a half bridge converter. As many electronic devices are sensitive to size and efficiency of the power conversion circuit, new power converters can provide relatively higher efficiency and lower size for the new electronic devices.

SUMMARY

In some embodiments, a power converter is disclosed. The power converter includes a GaN-based die, a switch formed on the GaN-based die and having a gate terminal, a source terminal and a drain terminal, where the switch is arranged to be selectively conductive according to a driver signal applied to the gate terminal, a buffer circuit formed on the GaN-based die and arranged to receive an input signal and generate a corresponding differential output signal at a first output terminal and at a second output terminal, and a voltage level converter formed on the GaN-based die and having a first input terminal coupled to the first output terminal via a first capacitor and having a second input terminal coupled to the second output terminal via a second capacitor, and where the first and second capacitors are formed on the GaN-based die, and where an output terminal of the voltage level converter is coupled to the gate terminal and arranged to generate the driver signal.

In some embodiments, the input signal is referenced to a ground and the driver signal is referenced to a floating voltage.

In some embodiments, the input signal is a pulse width modulated (PWM) signal.

In some embodiments, the power converter further includes a comparator formed on the GaN-based die and coupled between the voltage level converter and the gate terminal.

In some embodiments, the power converter further includes a latch circuit formed on the GaN-based die and coupled between the comparator and the gate terminal.

In some embodiments, the first and second capacitors are metal-insulator-metal capacitors.

In some embodiments, the switch, the buffer circuit, the voltage level converter and the first and second capacitors are formed monolithically.

In some embodiments, a circuit is disclosed. The circuit includes a GaN-based die, a switch formed on the GaN-based die and having a gate terminal, a source terminal and a drain terminal, where the switch is arranged to be selectively conductive according to a driver signal applied to the gate terminal, a buffer circuit formed on the GaN-based die and having an input terminal and an first output terminal, the buffer circuit arranged to receive an input signal at the input terminal and generate a first output signal at the first output terminal, a capacitor formed on the GaN-based die and having a first input terminal and a second output terminal, the first input terminal coupled to the first output terminal and arranged to receive the first output signal and generate a second output signal at the second output terminal, where the first output signal is referenced to a ground at the second output signal is referenced to a floating voltage, and a voltage level converter formed on the GaN-based die and coupled to the second output terminal and arranged to generate the driver signal.

In some embodiments, the input signal is a pulse width modulated (PWM) signal.

In some embodiments, the circuit further includes a comparator formed on the GaN-based die and coupled between the voltage level converter and the gate terminal.

In some embodiments, the circuit further includes a latch circuit formed on the GaN-based die and coupled between the comparator and the gate terminal.

In some embodiments, the capacitor is a metal-insulator-metal capacitor.

In some embodiments, the buffer circuit, the voltage level converter and the capacitor are formed monolithically.

In some embodiments, a power converter is disclosed. The power converter includes a GaN-based die, a switch formed on the GaN-based die and having a gate terminal, a source terminal and a drain terminal, where the switch is arranged to be selectively conductive according to a driver signal applied to the gate terminal, a buffer circuit formed on the GaN-based die and arranged to receive an input signal and generate a corresponding differential output signal at a first output terminal and at a second output terminal, and a voltage level converter formed on the GaN-based die and having a first input terminal coupled to the first output terminal via a first capacitor and having a second input terminal coupled to the second output terminal via a second capacitor, where the differential output signal is referenced to a ground, where the first and second capacitors are arranged to receive differential output signal and generate a second differential output signal that is referenced to a floating voltage, and where an output terminal of the voltage level converter is coupled to the gate terminal and arranged to generate the driver signal.

In some embodiments, the input signal is a pulse width modulated (PWM) signal.

In some embodiments, the power converter further includes a comparator formed on the GaN-based die and coupled between the voltage level converter and the gate terminal.

In some embodiments, the power converter further includes a latch circuit formed on the GaN-based die and coupled between the comparator and the gate terminal.

In some embodiments, the first and second capacitors are metal-insulator-metal capacitors.

In some embodiments, the switch, the buffer circuit, the voltage level converter and the first and second capacitors are formed monolithically.

In some embodiments, the power converter further includes a positive dV/dt detector circuit coupled to the source terminal and a negative dV/dt detector circuit coupled to the drain terminal.

DETAILED DESCRIPTION

Circuits and related techniques disclosed herein relate generally to power conversion circuits. More specifically, circuits, devices and related techniques disclosed herein relate to monolithic gallium nitride (GaN) devices with integrated capacitive level shifter circuits. In some embodiments, the monolithic GaN device can include a GaN power transistor, level shifter circuits, and low side circuits that are all integrated on a single GaN-based die. In various embodiments, the monolithic GaN device can mitigate substrate noise issues related to integration of a power transistor with level shifter circuits by using capacitors for the level shifting function instead of transistors. In some embodiments, the monolithic GaN device can be a high side device that includes capacitive level shifter circuits and low side circuits that can minimize sensitivity of those circuits to substrate noise.

In various embodiments, disclosed capacitive level shifter circuits can be insensitive to substrate noise, to variations in the two dimensional electron gas (2DEG) or to charge trapping in the GaN substrate. In some embodiments, the monolithic GaN device consumes relatively small amounts of quiescent current thereby reducing the power losses in the monolithic GaN device. The reduction in power loss can enable relatively high operational frequencies of the power conversion circuit. In some embodiments, the integration of capacitive level shifter and low side circuits with the high side GaN power transistor on the same high side GaN die can enable a reduction of propagation delays and eliminate use of noise filters. This can enable higher operational frequency for the high side die and for the power conversion circuit.

In some embodiments, the monolithic high side GaN device can enable a reduction of die area resulting in reduced system costs. Various inventive embodiments are described herein, including methods, processes, systems, devices, and the like. One or more of the embodiments disclosed herein may include one or more features disclosed in U.S. Pat. No. 10,193,554 filed on Nov. 15, 2017, entitled "Capacitively Coupled Level Shifter", the contents of which are incorporated herein by reference in their entirety for all purposes.

Several illustrative embodiments will now be described with respect to the accompanying drawings, which form a part hereof. The ensuing description provides embodiment(s) only and is not intended to limit the scope, applicability, or configuration of the disclosure. Rather, the ensuing description of the embodiment(s) will provide those skilled in the art with an enabling description for implementing one or more embodiments. It is understood that various changes may be made in the function and arrangement of elements without departing from the spirit and scope of this disclosure. In the following description, for the purposes of explanation, specific details are set forth in order to provide a thorough understanding of certain inventive embodiments. However, it will be apparent that various embodiments may be practiced without these specific details. The figures and description are not intended to be restrictive. The word "example" or "exemplary" is used herein to mean "serving as an example, instance, or illustration." Any embodiment or design described herein as "exemplary" or "example" is not necessarily to be construed as preferred or advantageous over other embodiments or designs.

Figure 1:
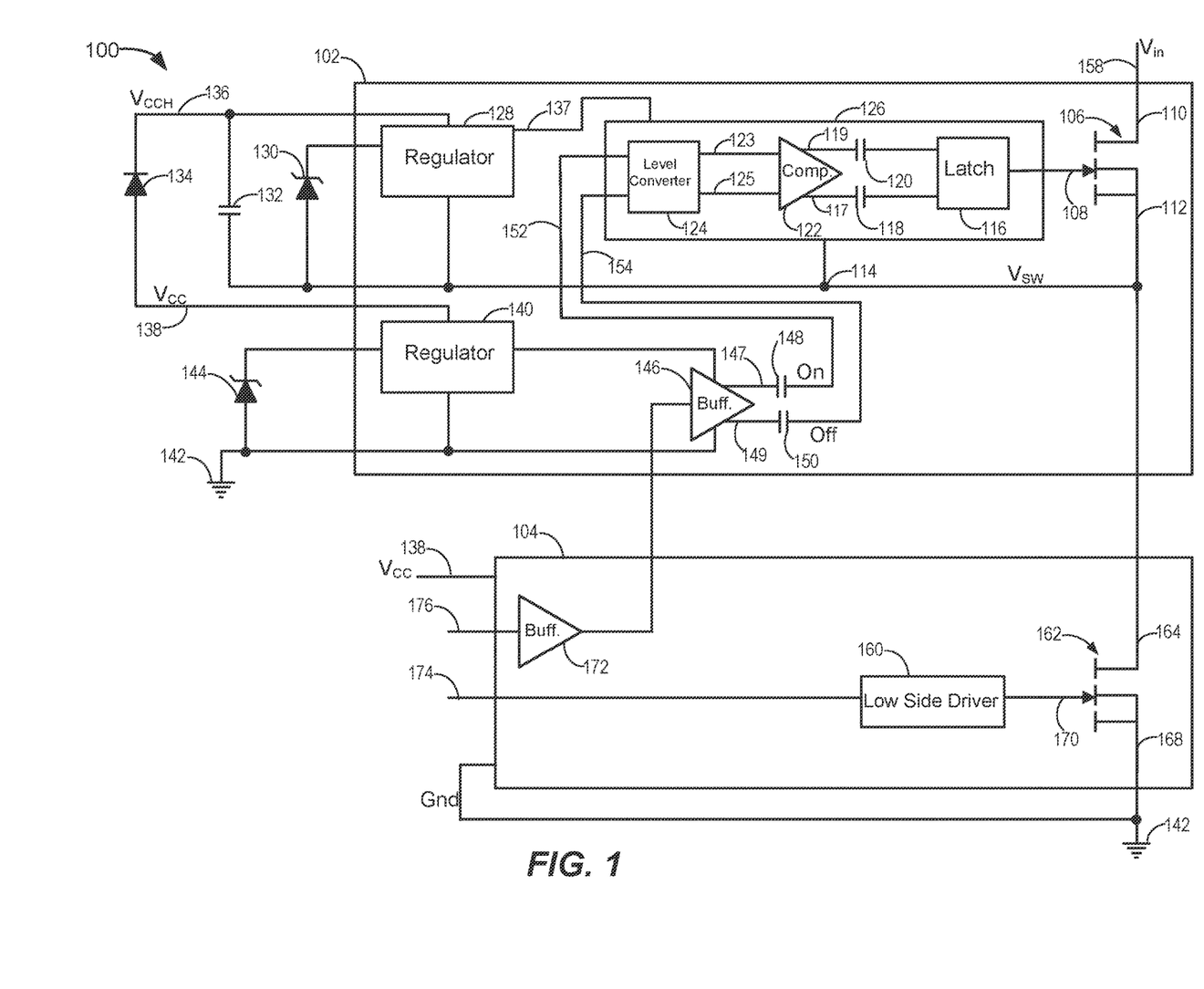
FIG. 1 illustrates a circuit including a monolithic high side GaN device according to an embodiment of the disclosure.

FIG. 1 illustrates a circuit 100 including a monolithic high side GaN device according to an embodiment of the disclosure. As shown in FIG. 1, circuit 100 can include a monolithic high side GaN device 102. Circuit 100 can also include a monolithic low side GaN device 104. Circuit 100 can be used in any suitable power conversion circuit such as, but not limited to, half bridge circuits such as a buck converter. The monolithic high side GaN device 102 can include a first regulator 140, a second regulator 128, a buffer circuit 146, and a sub-circuit 126. Sub-circuit 126 can include a direct current (DC) voltage level conversion circuit 124, a comparator circuit 122 and a latch circuit 116. In some embodiments, the first regulator 140 and the second regulator 128 may each be a linear regulator. In various embodiments, the comparator circuit may include two or more comparators.

The monolithic high side GaN device 102 can also include a GaN power transistor 106, having a gate 108, a drain 110 and a source 112. In various embodiments, the monolithic high side GaN device 102 may include a driver stage (not shown in FIG. 1) connected between the latch circuit 116 and the gate 108. The drain 110 of the GaN power transistor 106 can be connected to an input power source (Vin) at terminal 158, and the source 112 of the GaN power transistor 106 can be connected to node 114 (switch node (Vsw)). The first regulator 140 can provide a regulated power source for the buffer circuit 146. The buffer circuit 146 can provide control signals at terminals 147 (on) and 149 (off) that can be level shifted by level shifter capacitors 148 and 150, respectively, to produce high side control signals at nodes 152 (on) and 154 (off). In some embodiments, level shifter capacitors 148 and 150 can be formed from metal-insulator-metal (MIM) layers. In various embodiments, the MIM capacitor can have relatively high operational voltage ratings, for example, 1200 V. The level shifter capacitors 148 and 150 can be formed from any other suitable semiconductor materials.

A DC voltage level conversion circuit 124 can change the DC voltage level of signals at nodes 152 (on) and 154 (off) and generate output signals at nodes 125 and 127. The output signals at nodes 125 and 127 can be provided to a comparator circuit 122. The comparator circuit 122 can compare the on/off signals and provide output signals at terminals 119 and 117. In some embodiments, signals at nodes 123 and 129 can be provided to another comparator that is similar to comparator circuit 122. The AC portion of the signals at terminals 119 and 117 are transmitted to a latch circuit 116 via capacitors 120 and 118, respectively. The latch circuit 116 can then drive a gate 108 of the GaN power transistor 106. The second regulator 128 can provide a regulated power source at node 137 to the sub-circuit 126, while the ground of sub-circuit 126 can be connected to node 114, which can be the switching node (Vsw) in a power conversion circuit such as a DC-DC buck converter.

The Vsw node can be a noisy node since relatively large currents can flow through the Vsw node causing large amounts of voltage fluctuations due to the presence of circuit parasitics. These large currents can be present when the GaN power transistor 106 switches on or off. The noise at node 114 may couple into the substrate of the semiconductor die and can degrade performance of other sensitive circuits that are on the same substrate. For example, substrate noise may cause an increase in on-resistance ($R_{dson}$) of level shifter transistors, may cause variations in the 2DEG charge density or may cause charge trapping in the GaN substrate which can increase $R_{dson}$ of the devices. In some embodiments, in order to prevent the substrate noise from affecting the low side circuits, components of the low side circuits are shielded from the substrate in order to prevent the substrate noise from degrading their performance.

In various embodiments, the level shifting function is realized using capacitors instead of transistors. In the monolithic high side GaN device 102, the level shifter capacitors 148 and 150 are used for level shifting. The level shifter capacitors 148 and 150 can be formed from, for example, but not limited to, metal-insulator-metal layers (MIM). These MIM capacitors can be less susceptible to substrate noise because they are formed from metal and insulator layers that are separated from the substrate by relatively large separations, unlike transistor-based level shifter circuits where the level shifting transistors have 2DEG layers that are susceptible to substrate noise and susceptible to trapping issues in the GaN substrate. Therefore, the MIM capacitor-based level shifter circuits can be less susceptible to substrate noise than transistor-based level shifter circuits.

In some embodiments, the monolithic high side GaN device 102 can consume reduced amounts of quiescent current as compared to a device with transistor-based level shifters. This is due to capacitive level shifting circuits not consuming quiescent current because they are pulse driven. Current approaches using transistor-based level shifting circuits are not pulse driven and they draw current from the high side power source resulting in increased power losses. In various embodiments, the reduction of quiescent current can reduce the switching power losses thus enabling relatively high operational frequencies of the power conversion circuit. As an example, a silicon based high side power converter die may operate up to a maximum frequency of 500 KHz because its operational frequency is limited due to power losses caused by its quiescent current, while embodiments of the present disclosure with capacitive level shifter circuits can operate up to a frequency of 2 MHz in half bridge applications. In some embodiments, the monolithic high side GaN device 102 can operate up to 8 MHz in standalone applications.

In some embodiments, the integration of the level shifting circuits and the low side circuits into the monolithic high side GaN device 102 can overcome signal integrity issues between separate low side die and a high side die where the level shifting circuits are disposed in the low side die. This is because level shifter capacitors 148 and 150, and their buffer circuit 146 and low side circuits such as the first regulator 140 are tightly integrated on the same die as the GaN power transistor 106, resulting in minimized circuit parasitics compared to current approaches where the level shifter circuits and the low side circuits are disposed in the low side die separate from the GaN power transistor 106, and the signals are transmitted between the low side die and the high side die. Embodiments of the present disclosure can enable improvements in manufacturability by overcoming signal integrity issues, resulting in achievement of high manufacturing yields.

In the monolithic high side GaN device 102, the first regulator 140 can be connected between nodes 138 (power source Vcc) and 142 (ground). A zener diode 144 (or 130) can be connected to the first regulator 140 (or 128) to provide a reference voltage to the linear regulator. In some embodiments, the zener diode 144 may be external to the monolithic high side GaN device 102. In various embodiments, the zener diode 144 may be integrated into the monolithic high side GaN device 102. The first regulator 140 can provide the power supply for the buffer circuit 146. The second regulator 128 can be connected between nodes 136 (high side power supply $V_{CCH}$) and Vsw. A zener diode 130 can be connected to the second regulator 128 to arrest any spurious voltage spikes. In some embodiments, the zener diode 130 may be external to the monolithic high side GaN device 102. In various embodiments, the zener diode 130 may be integrated into the monolithic high side GaN device 102. Further, a capacitor 132 can be connected between nodes 136 and 114 in order to smooth out voltage fluctuations. In some embodiments, capacitor 132 may be integrated into the monolithic high side GaN device 102. A diode 134 can be connected between $V_{CCH}$ node 136 and Vcc node 138. In this way, a voltage at node $V_{CCH}$ with respect to node 114, which is a floating node (Vsw), can be a diode voltage drop below a voltage at $V_{CC}$ node 138 with respect to ground node 142.

Circuit 100 can include a low side GaN device 104 having a low side GaN power transistor 162. The low side GaN power transistor 162 can have a gate 170, a drain 164 and a source 168. Drain 164 can be connected to the node 114, while source 168 can be connected to ground node 142. The low side die can include a low side driver 160 that is connected to the gate 170 of the low side GaN power transistor 162 and can provide drive voltage to the gate 170. A low side input signal ($I_{NL}$) can be applied at terminal 174 at the input of the low side driver to provide the control signal for the low side driver 160. The low side GaN device 104 may also include a buffer 172.

A high side input signal $I_{NH}$ can be applied at the input terminal 176 of buffer 172. The buffered high side input signal $I_{NH}$ can be transmitted to the buffer circuit 146 on the monolithic high side GaN device 102. In some embodiments, the monolithic high side GaN device 102 may not include the buffer circuit 146 and instead use the output of the buffer 172 to drive the level shifter capacitors 148 and 150. In various embodiments, the low side GaN device 104 may not include the buffer 172. In some embodiments, the $I_{NH}$ signal can be generated internally in the low side GaN device 104 in order to provide shoot-through protection. In various embodiments, the low side GaN device 104 can be connected to a power supply Vcc at node 138 and to the ground node 142. In various embodiments, circuit 100 may not include a low side GaN device 104.

In some embodiments, the monolithic high side GaN device 102 may not include first and second regulators 140 and 128. Instead, these regulators may be included on the low side GaN device 104. In various embodiments, the first and second regulators 140 and 128, respectively, can be external to the monolithic high side GaN device 102 and/or not integrated within the monolithic low side GaN device 104. In some embodiments, the monolithic high side GaN device 102 can be used as a stand-alone die and can be used without being paired with a low side die. In various embodiments, the monolithic high side GaN device 102 may be used in half bridge applications by being paired with low side die. In some embodiments, the monolithic high side GaN device 102 can be used in other suitable power conversion circuits. In various embodiments, the monolithic high side GaN device 102 can eliminate or minimize use of noise filters because the monolithic high side GaN device 102 overcomes substrate noise issues associated with a switching high side GaN power transistor. As appreciated by one of skill in the art having the benefit of this disclosure, although certain devices are described above as monolithic, in other embodiments any of the components within those devices can be implemented as one or more discreet (e.g., separate) electronic components.

Figure 2:
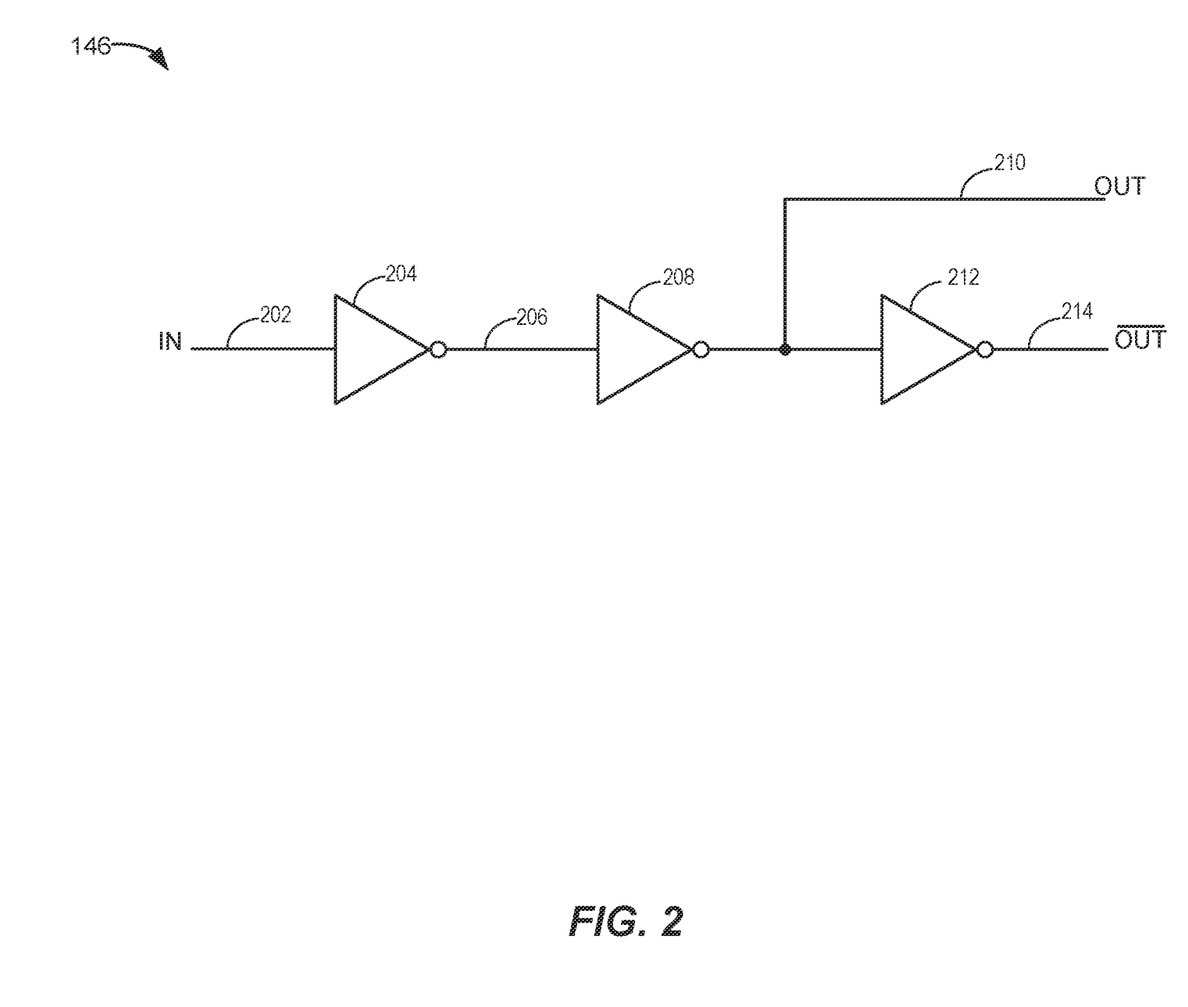
FIG. 2 illustrates a buffer circuit according to an embodiment of the disclosure.

Now referring to FIG. 2, one embodiment of buffer circuit 146 is illustrated in greater detail. In the illustrated embodiment, buffer circuit 146 can include multiple stages, for example, three stages of inverters 204, 208 and 212. First stage inverter 204 can receive an input signal (IN) at node 202 and provide an inverted signal at node 206. Second stage inverter 208 can receive the output signal from inverter 204 as an input signal at node 206 and provide an inverted signal (OUT) at node 210. Third stage inverter 212 can receive the output signal from inverter 208 as an input signal at node 210 and provide an inverted signal (inverse OUT) at node 214. Thus buffer circuit 146 can receive signal IN at node 202 and provide signals OUT and inverse OUT at nodes 210 and 214, respectively. In some embodiments, the inverter stages in the buffer circuit 146 can be realized using transistors with shields that can provide substrate noise immunity for those transistors. In various embodiments, the inverter stages in the buffer circuit 146 can be realized using transistors with noise filters added to their gate terminal in order to filter out substrate noise.

Figure 3:
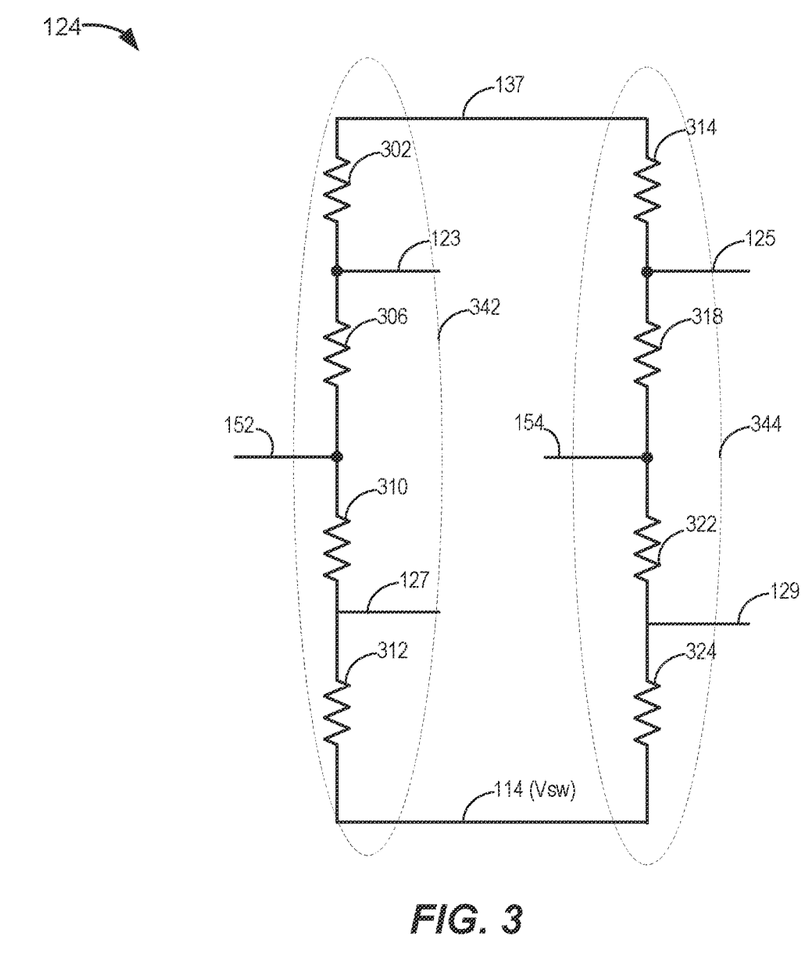
FIG. 3 illustrates a DC voltage level conversion circuit according to an embodiment of the disclosure.

Now referring to FIG. 3, one embodiment of DC voltage level conversion circuit 124 is illustrated in greater detail. In the illustrated embodiment, the DC voltage level conversion circuit 124 can include resistors arranged in series in resistor divider arrangements. The DC voltage level conversion circuit 124 can include a first resistor divider 342 and a second resistor divider 344. Resistors 302, 306, 310 and 312 can be connected in series to form the first resistor divider 342 between node 137 and 114 (Vsw). An input signal at node 152 (On) can be converted to an output signal at node 123 that has a different DC level. Further, an input signal at node 152 (On) can be converted to an output signal at node 127 that has a different DC level. Resistors 314, 318, 322 and 324 can be connected in series to form the second resistor divider 344 between node 137 and 114 (Vsw). An input signal at node 154 (Off) can be converted to an output signal at node 125 that has a different DC level. Further, an input signal at node 154 (Off) can be converted to an output signal at node 129 that has a different DC level. In this way, the output signals at nodes 123, 125, 127 and 129 can be DC shifted such that they can have appropriate DC level in order to be accepted by the following stage. In various embodiments, the resistors used to form the resistor divider can be formed from semiconductor layers. Furthermore, the resistors can be laid out in such a way so as to shield them from substrate noise. In some embodiments, DC voltage level conversion circuit 124 can have two or more output nodes.

In some embodiments, the resistor values in the second resistor divider 344 can have values that are, for example, two to three times as large as the resistor values in the first resistor divider 342, while keeping the resistor divider ratios the same as the first resistor divider 342. This can cause off-dominance of the second resistor divider 344. In this way, the GaN power transistor 106 is prevented from turning off immediately following a turn-on, which may be caused due dV/dt. Therefore, by having off-dominance, improved dV/dt immunity can be achieved in the monolithic high side GaN device 102. The off-dominance of the second resistor divider 344 and its function during a dV/dt event is described in further detail in FIG. 6.

Figure 4:
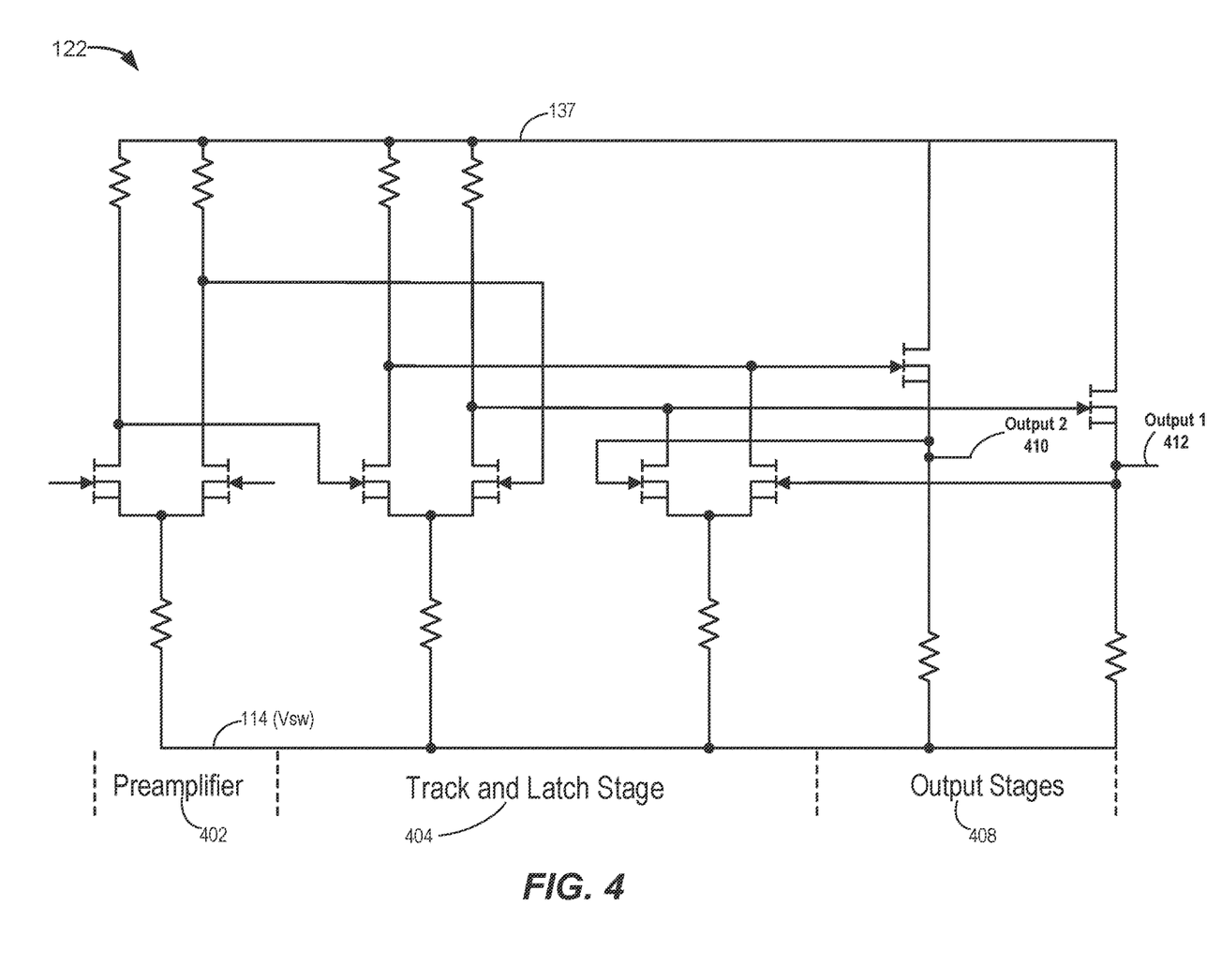
FIG. 4 illustrates a comparator circuit according to an embodiment of the disclosure.

Now referring to FIG. 4, one embodiment of comparator circuit 122 is illustrated in greater detail according to an embodiment of the disclosure. The comparator circuit 122 can include several stages including a preamplifier stage 402, a track and latch stage 404, and output stages 408. The comparator circuit 122 can compare the signal at node 125 to a signal at node 127. In various embodiments, a second comparator circuit can be used to compare a signal at node 123 to a signal at node 129. In some embodiments, the comparator circuit 122 can integrate hysteresis in order to prevent output voltage oscillations that may occur due to substrate noise. The comparator circuit 122 can produce two output signals at 410 and 412. In various embodiments, comparator circuits may be used that have differential inputs. In some embodiments, the monolithic high side GaN device 102 may utilize two comparator circuits.

Figure 5:
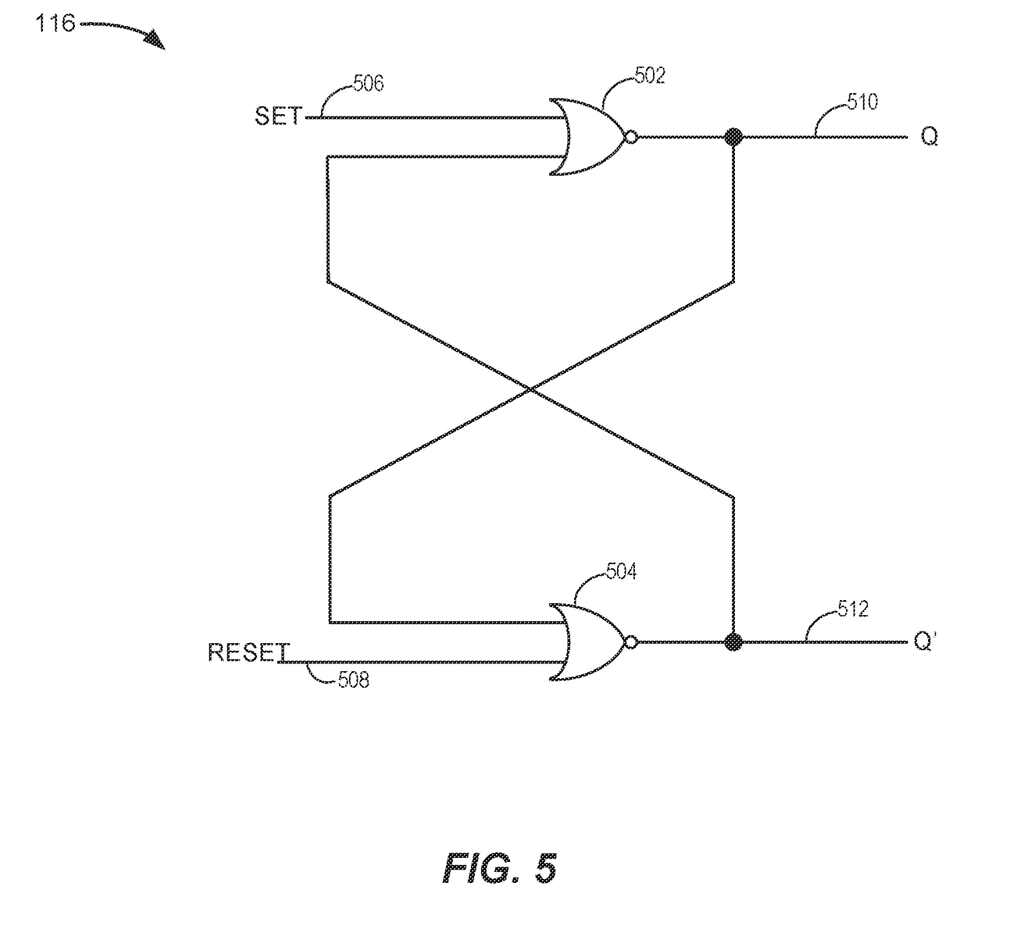
FIG. 5 illustrates a latch circuit according to an embodiment of the disclosure.

Now referring to FIG. 5, one embodiment of a latch circuit 116 is illustrated in greater detail according to an embodiment of the disclosure. The latch circuit 116 can include a pair of cross coupled NOR gates, 502 and 504. The latch circuit 116 can include a SET input terminal 506 and a RESET input terminal 508. The latch circuit 116 can include an output signal at terminal 510 (Q) and an inverse of that output (Q') at terminal 512. The output of the latch circuit 116 may drive the gate 108 of the GaN power transistor 106. In some embodiments, the output of the latch circuit 116 may connect to a gate driver circuit that drives the gate 108 of the GaN power transistor 106. The latch circuit 116 has two stable states where the output is held at a low or high state, such that the output does not fluctuate due to substrate noise.

Figure 6:
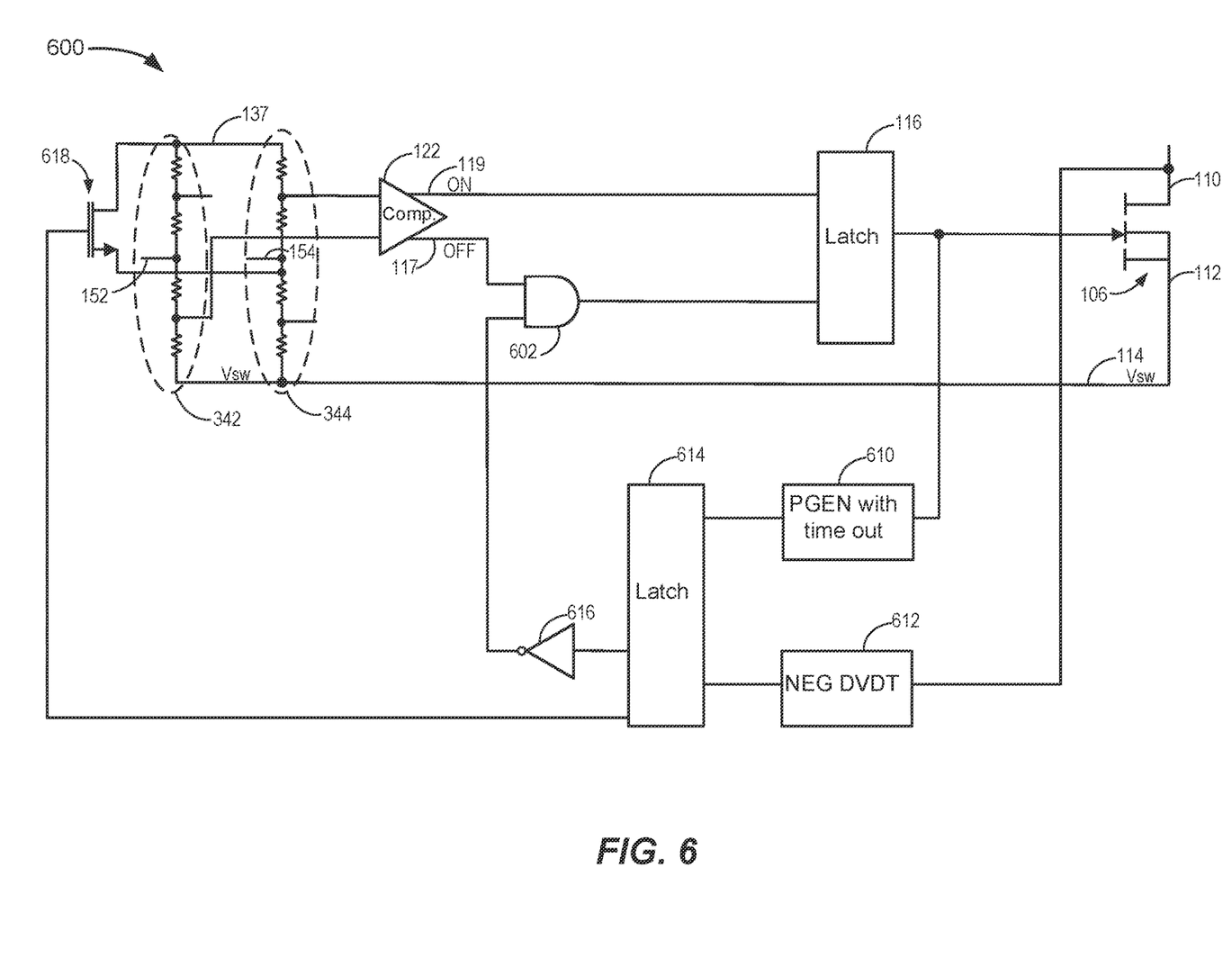
FIG. 6 illustrates a circuit that can mitigate effects of dV/dt events on a noisy substrate according to an embodiment of the disclosure.

Now referring to FIG. 6, one embodiment of a circuit 600 is illustrated that can mitigate effects of dV/dt according to an embodiment of the disclosure. When the GaN power transistor 106 turns on, the source 112 of the GaN power transistor 106, which is connected to node 114 (Vsw), can get pulled up rapidly. The rapid rise of the voltage at the Vsw node may cause the gate of the GaN power transistor 106 to turn off. Circuit 600 can be utilized to prevent this from occurring and can assure that the GaN power transistor 106 stays on.

When the GaN power transistor 106 turns on, it may cause a positive dV/dt. The second resistor divider 344, which is arranged to be in an off-dominance configuration, may cause the GaN power transistor 106 to turn-off immediately after its turn-on. To prevent this from occurring and to keep the GaN power transistor 106 in the on state, a negative dV/dt detection circuit 612 can be added on the monolithic high side GaN device 102. A negative dV/dt can be present when the node 114 is slewing up rapidly. When the GaN power transistor 106 turns on, the negative dV/dt detection circuit 612 can sense the voltage at the drain 110.

After the negative dV/dt event is over, the output of the latch circuit 116 is high. The output of latch circuit 116 is connected to a pulse generator with time out circuit 610. Upon receiving the output of the latch circuit 116, the pulse generator with time out circuit 610 sets a latch 614. The output of the latch 614 is then fed into an AND gate 602 through an inverter 616. As long as the output of the latch 614 is high, the output of the AND gate 602 stays low; therefore no signals from the resistor dividers 344 and 342 or the comparator circuit 122 can go through the AND gate 602. When the dV/dt event is over, the AND gate 602 allows signals from the comparator circuit 122 to go through to the gate of the GaN power transistor 106. Further, transistor 618 can pull up on node 154 to assure that node 154 does not get pulled down. Moreover, transistor 618 can ensure that when the dV/dt event is over, node 154 does not stay low and that it is pulled up rapidly. As appreciated by one of ordinary skill in the art having the benefit of this disclosure, variations of the sub-circuits in circuit 600 may be used in order to mitigate the effects of dV/dt on a monolithic high side GaN die.

Figure 7:
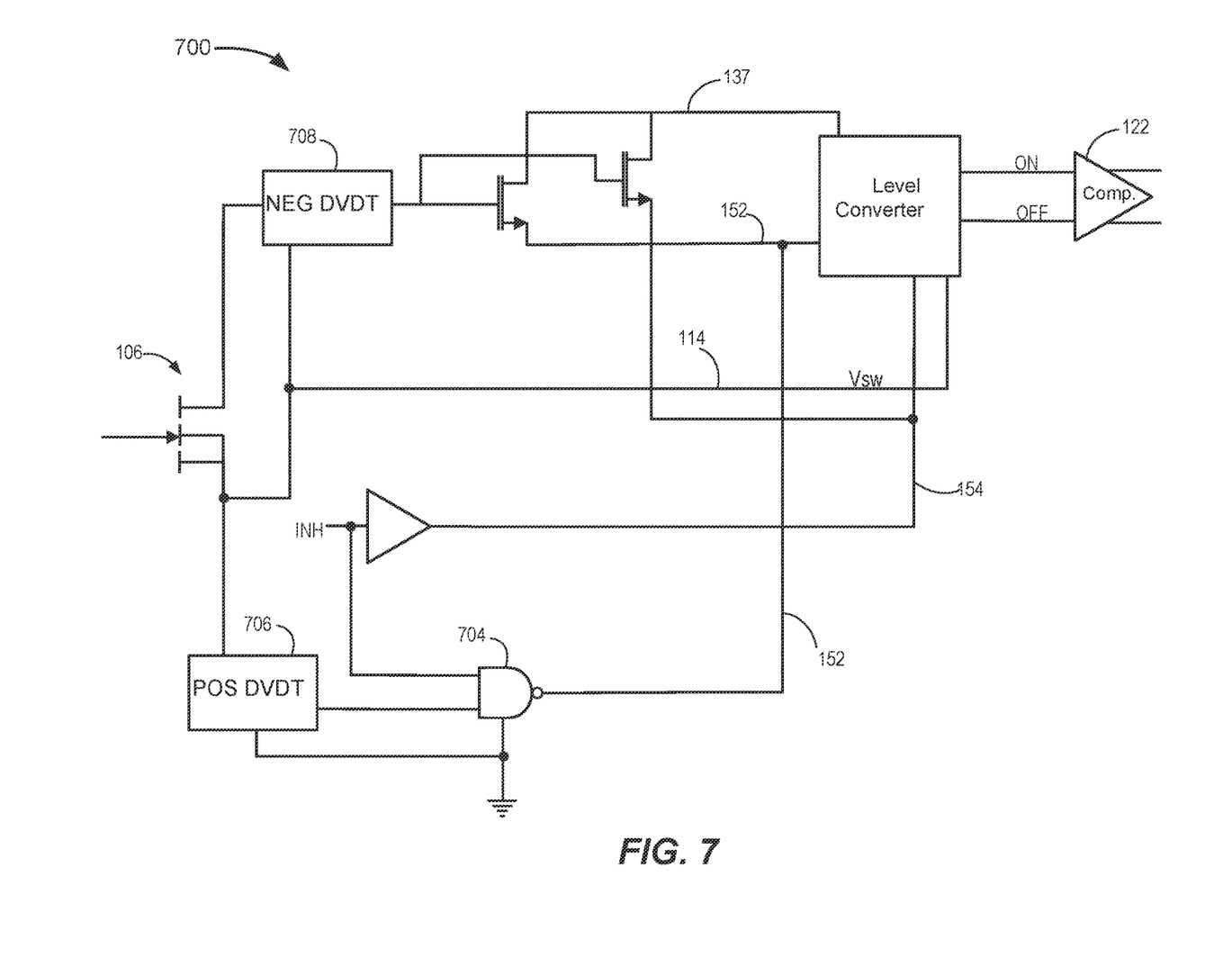
FIG. 7 illustrates a circuit that can transmit a signal during a dV/dt event to turn on the high side GaN power transistor according to an embodiment of the disclosure.

Now referring to FIG. 7, a circuit 700 is illustrated that can transmit a signal during a dV/dt event to turn on the GaN power transistor 106, according to an embodiment of the disclosure. Circuit 700 can assure transmission of a turn-on signal to the GaN power transistor 106 during a dV/dt event even when the substrate is noisy during a dV/dt event. Circuit 700 can include a positive dV/dt detector circuit 706 which is ground-referenced. In some embodiments, the positive dV/dt detector circuit 706 can use a capacitor to detect the source signal of the GaN power transistor 106. The output of the positive dV/dt detector circuit 706 and the INH (High side turn on signal) are fed into the inputs of a NAND gate 704. When INH signal is high and the output of the positive dV/dt detector circuit 706 is high, the output of the NAND gate 704 is low, thereby node 152 gets pulled low. In some embodiments, the output of the NAND gate 704 can be coupled to the node 152 via a capacitor. Thus, the signal at node 152 (On signal) gets pulled down relatively harder than node 154 (Off signal). This can cause the comparator circuit 122 to turn on the signal at terminal 119 (On signal), which can turn on the latch circuit 116 and subsequently turn the GaN power transistor 106.

Circuit 700 can also include a negative dV/dt detector circuit 708 that is connected to the drain of the GaN power transistor 106. The negative dV/dt detector circuit 708 can be utilized to pull up on nodes 152 (On) and 154 (Off) signals at the same time. In this way, nodes 152 and 154 do not fluctuate during a dV/dt event. Further, the positive dV/dt detector circuit 706 pulls down on the node 152, which can turn on the GaN power transistor 106. In some embodiments, the negative dV/dt detector circuit 708 can use a capacitor to detect the drain signal of the GaN power transistor 106.

Although monolithic high side GaN devices with integrated capacitive level shifters are described and illustrated herein with respect to one particular configuration of a monolithic high side GaN device with integrated capacitive level shifters, embodiments of the disclosure are suitable for use with other configurations of high side semiconductor devices. For example, high side silicon based or silicon carbide based devices can employ embodiments of the disclosure to mitigate effects of noisy substrates or to manage dV/dt events.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

Terms "and," "or," and "an/or," as used herein, may include a variety of meanings that also is expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, B, C, AB, AC, BC, AA, AAB, ABC, AABBCCC, etc.

Reference throughout this specification to "one example," "an example," "certain examples," or "exemplary implementation" means that a particular feature, structure, or characteristic described in connection with the feature and/or example may be included in at least one feature and/or example of claimed subject matter. Thus, the appearances of the phrase "in one example," "an example," "in certain examples," "in certain implementations," or other like phrases in various places throughout this specification are not necessarily all referring to the same feature, example, and/or limitation. Furthermore, the particular features, structures, or characteristics may be combined in one or more examples and/or features.

In the preceding detailed description, numerous specific details have been set forth to provide a thorough understanding of claimed subject matter. However, it will be understood by those skilled in the art that claimed subject matter may be practiced without these specific details. In other instances, methods and apparatuses that would be known by one of ordinary skill have not been described in detail so as not to obscure claimed subject matter. Therefore, it is intended that claimed subject matter not be limited to the particular examples disclosed, but that such claimed subject matter may also include all aspects falling within the scope of appended claims, and equivalents thereof.

What is claimed is:

1. A power converter comprising:
   a GaN-based die;

a switch formed on the GaN-based die and having a gate terminal, a source terminal and a drain terminal, wherein the switch is arranged to be selectively conductive according to a driver signal applied to the gate terminal;

a buffer circuit formed on the GaN-based die and arranged to receive an input signal and generate a corresponding differential output signal at a first output terminal and at a second output terminal; and a voltage level converter formed on the GaN-based die and having a first input terminal coupled to the first output terminal via a first capacitor and having a second input terminal coupled to the second output terminal via a second capacitor, and wherein the first and second capacitors are formed on the GaN-based die, and wherein an output terminal of the voltage level converter is coupled to the gate terminal and arranged to generate the driver signal.

2. The power converter of claim 1, wherein the input signal is referenced to a ground and the driver signal is referenced to a floating voltage.

3. The power converter of claim 1, wherein the input signal is a pulse width modulated (PWM) signal.

4. The power converter of claim 1, further comprising a comparator formed on the GaN-based die and coupled between the voltage level converter and the gate terminal.

5. The power converter of claim 4, further comprising a latch circuit formed on the GaN-based die and coupled between the comparator and the gate terminal.

6. The power converter of claim 1, wherein the first and second capacitors are metal-insulator-metal capacitors.

7. The power converter of claim 1, wherein the switch, the buffer circuit, the voltage level converter and the first and second capacitors are formed monolithically.

8. A circuit comprising:
a GaN-based die;
a switch formed on the GaN-based die and having a gate terminal, a source terminal and a drain terminal, wherein the switch is arranged to be selectively conductive according to a driver signal applied to the gate terminal;
a buffer circuit formed on the GaN-based die and having an input terminal and an first output terminal, the buffer circuit arranged to receive an input signal at the input terminal and generate a first output signal at the first output terminal;
a capacitor formed on the GaN-based die and having a first input terminal and a second output terminal, the first input terminal coupled to the first output terminal and arranged to receive the first output signal and generate a second output signal at the second output terminal, wherein the first output signal is referenced to a ground at the second output signal is referenced to a floating voltage; and
a voltage level converter formed on the GaN-based die and coupled to the second output terminal and arranged to generate the driver signal.

9. The circuit of claim 8, wherein the input signal is a pulse width modulated (PWM) signal.

10. The circuit of claim 8, further comprising a comparator formed on the GaN-based die and coupled between the voltage level converter and the gate terminal.

11. The circuit of claim 10, further comprising a latch circuit formed on the GaN-based die and coupled between the comparator and the gate terminal.

12. The circuit of claim 8, wherein the capacitor is a metal-insulator-metal capacitor.

13. The circuit of claim 8, wherein the switch, the buffer circuit, the voltage level converter and the capacitor are formed monolithically.

14. A power converter comprising:
a GaN-based die;
a switch formed on the GaN-based die and having a gate terminal, a source terminal and a drain terminal, wherein the switch is arranged to be selectively conductive according to a driver signal applied to the gate terminal;
a buffer circuit formed on the GaN-based die and arranged to receive an input signal and generate a corresponding differential output signal at a first output terminal and at a second output terminal; and
a voltage level converter formed on the GaN-based die and having a first input terminal coupled to the first output terminal via a first capacitor and having a second input terminal coupled to the second output terminal via a second capacitor;
wherein the differential output signal is referenced to a ground;
wherein the first and second capacitors are arranged to receive differential output signal and generate a second differential output signal that is referenced to a floating voltage; and
wherein an output terminal of the voltage level converter is coupled to the gate terminal and arranged to generate the driver signal.

15. The power converter of claim 14, wherein the input signal is a pulse width modulated (PWM) signal.

16. The power converter of claim 14, further comprising a comparator formed on the GaN-based die and coupled between the voltage level converter and the gate terminal.

17. The power converter of claim 16, further comprising a latch circuit formed on the GaN-based die and coupled between the comparator and the gate terminal.

18. The power converter of claim 14, wherein the first and second capacitors are metal-insulator-metal capacitors.

19. The power converter of claim 14, wherein the switch, the buffer circuit, the voltage level converter and the first and second capacitors are formed monolithically.

20. The power converter of claim 14, further comprising a positive dV/dt detector circuit coupled to the source terminal and a negative dV/dt detector circuit coupled to the drain terminal.

* * * * *